US006952053B2

(12) United States Patent
Huang et al.

(10) Patent No.: US 6,952,053 B2
(45) Date of Patent: Oct. 4, 2005

(54) METAL BOND PAD FOR INTEGRATED CIRCUITS ALLOWING IMPROVED PROBING ABILITY OF SMALL PADS

(75) Inventors: Tzu Hsin Huang, San Jose, CA (US); Liming Tsau, Irvine, CA (US); Vincent Chen, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 236 days.

(21) Appl. No.: 10/284,350

(22) Filed: Oct. 31, 2002

(65) Prior Publication Data
US 2004/0084693 A1 May 6, 2004

(51) Int. Cl.$^7$ ............................................. H01L 23/48
(52) U.S. Cl. .................... 257/762; 29/843; 257/773; 257/774; 257/775; 257/781; 257/784; 257/786
(58) Field of Search ........................... 29/843; 257/773, 257/774, 775, 781, 784, 786

(56) References Cited

U.S. PATENT DOCUMENTS

| 6,313,541 B1 | * | 11/2001 | Chan et al. ................... 257/786 |
| 6,362,531 B1 | * | 3/2002 | Stamper et al. .............. 257/781 |
| 6,560,862 B1 | * | 5/2003 | Chen et al. .................... 29/843 |

OTHER PUBLICATIONS

*AFM Sampling Prober (Preliminary Information): Non–Contact Electro–Force Sampling System*, at http://www.mfitech.com/products/samprob.htm, 2 pages (last visited Feb. 28, 2002).
"AFM Real–Time Prober," *Micron Force Instruments*, (last visited Feb. 28, 2002).
*AFM Real–Time Prober FAQs*, at http://www.mfitech.com/products/rtp_faq.htm, 3 pages (last visited Feb. 28, 2002).
*NDT Update: Microscopy—Submicron Electrical Probing*, at http://www.mfitech.com/press/ndtupdate_submicron_elec_probing.htm, 2 pages (last visited Feb. 28, 2002).
Krieg, K. et al., "Electrical Probing and Surface Imaging of Deep Sub–Micron Integrated Circuits," *Micron Force Instruments*, (last visited Feb. 28, 2002).
*Probe Tutorial*, at http://www.tektronix.com/Measurement/Products/catalog/Accessories/probes/index.html, 12 pages (last visited Feb. 28, 2002).
*Probing High–Speed Digital Designs*, at http://www.signalintegrity.com/articles/straight/probes.htm, 9 pages (last visited Feb. 28, 2002).

* cited by examiner

*Primary Examiner*—David Nelms
*Assistant Examiner*—Mai-Huong Tran
(74) *Attorney, Agent, or Firm*—Sterne, Kessler, Goldstein & Fox P.L.L.C.

(57) ABSTRACT

The present invention is a metal bond pad that provides electrical and mechanical connection to an integrated circuit (IC). The metal bond pad is configured to accommodate for probe travel during probing measurements, without modifying the size of the passivation opening of the bond pad. This enables higher density of active devices on the IC and therefore increases integration and lowers IC cost. The metal bond pad for the integrated circuit includes a substrate, a first metal layer, and a second metal layer. The substrate has the first metal layer disposed therein, having an opening from the top surface of the substrate. The second metal layer has a first-end portion, a second-end portion and a center portion disposed between the first-end portion and the second-end portion. The center portion of the second metal layer is aligned with the opening in the substrate and a bottom surface of the center portion is in contact with the top surface of the first metal layer. A top surface of the center portion has a recessed region that forms a first edge with said first-end portion and a second edge with said second-end portion. The first-end portion of the second metal layer is disposed on the top surface of the substrate and extends from the first edge of the recessed region. It has a length defined from the first edge of the opening. The second-end portion is also disposed on the top surface of the substrate and extends from the second edge of the recessed region. It has a length defined from the second edge of the recessed region, and it is longer than the length of the first-portion.

15 Claims, 7 Drawing Sheets

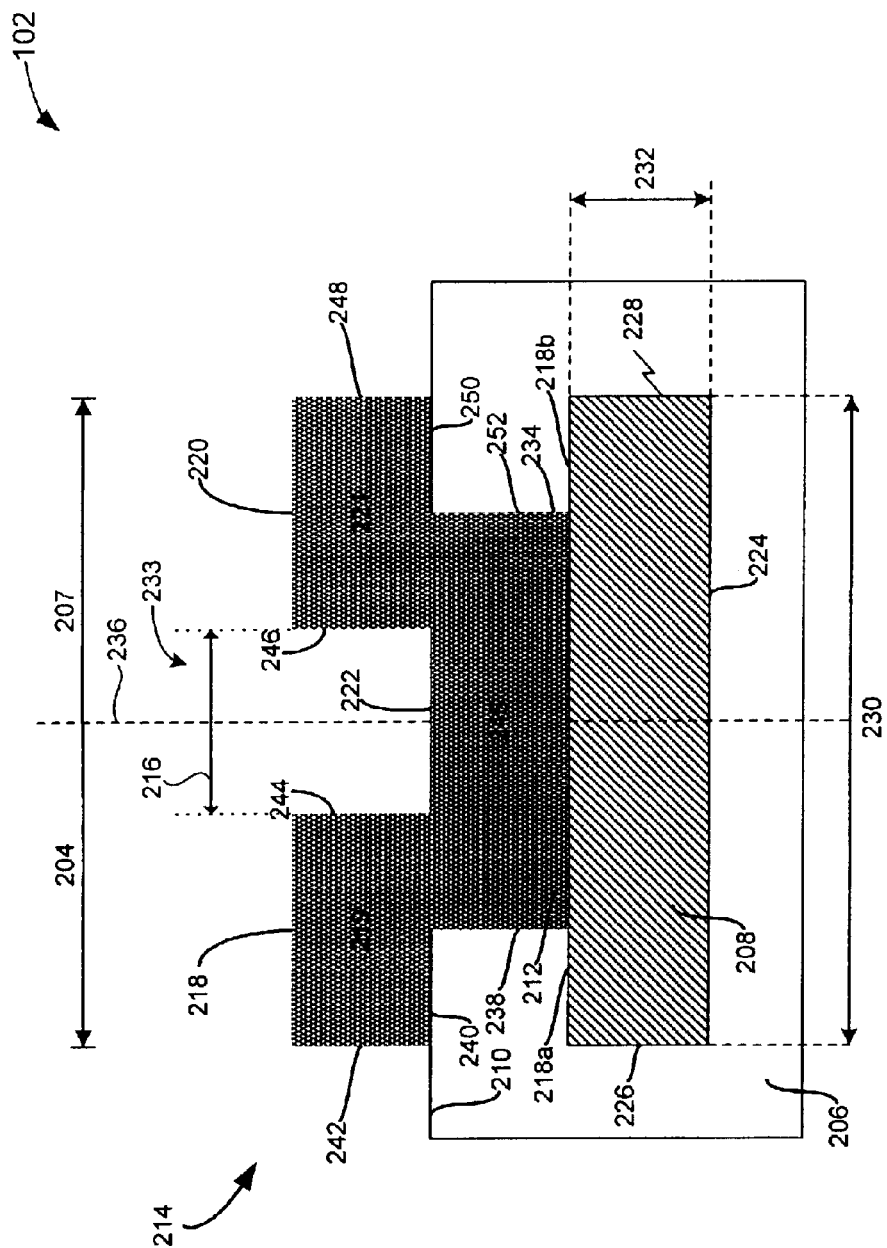
FIG. 2
Conventional

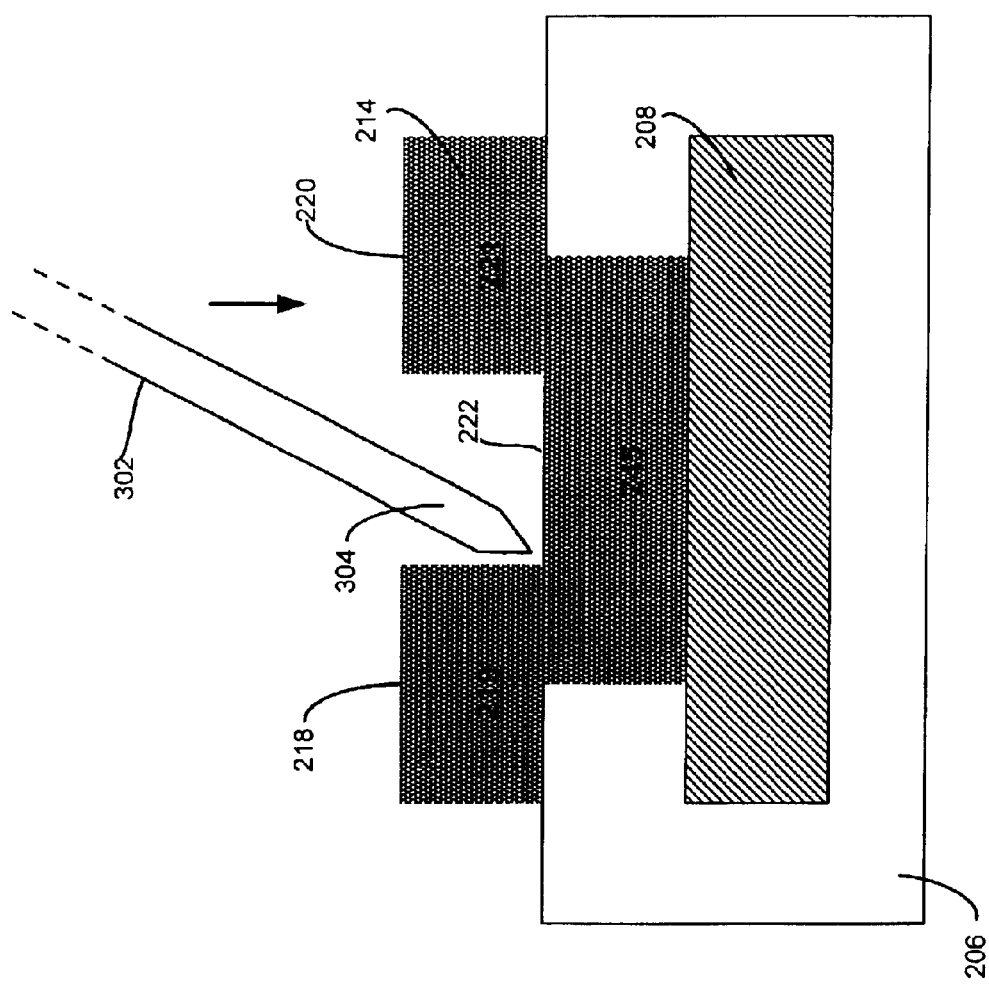
FIG. 3
Conventional

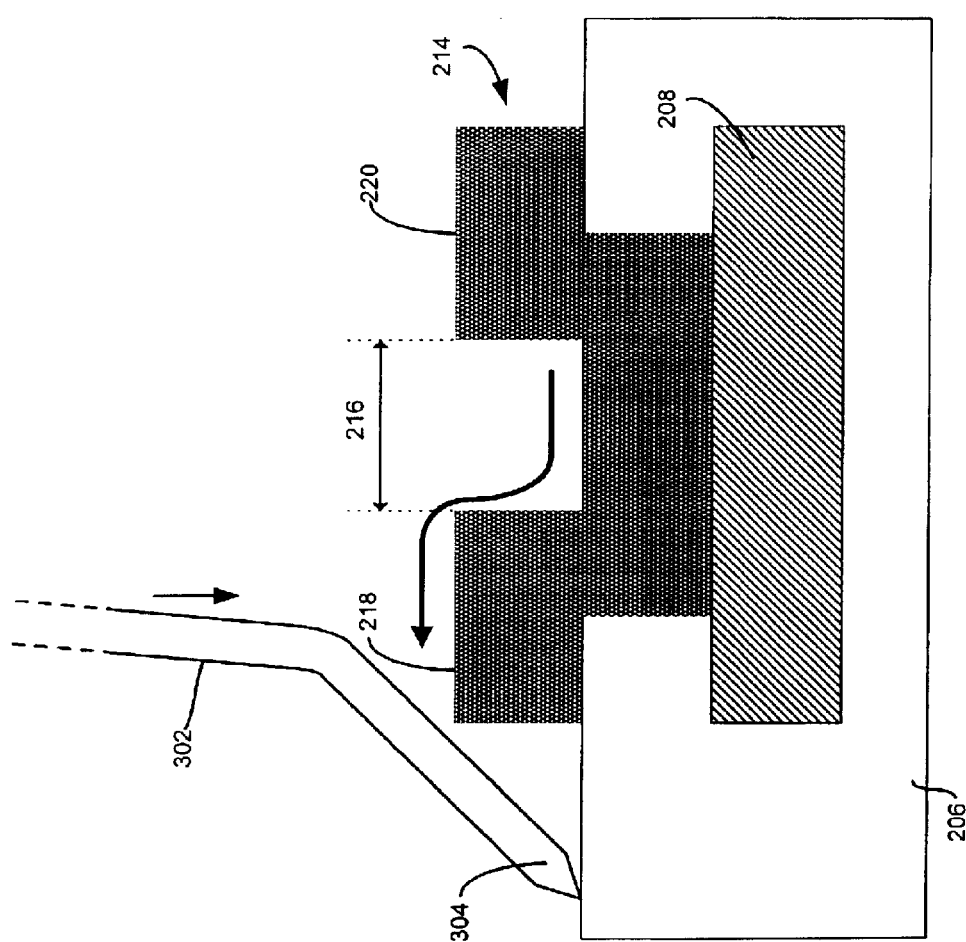
FIG. 4
Conventional

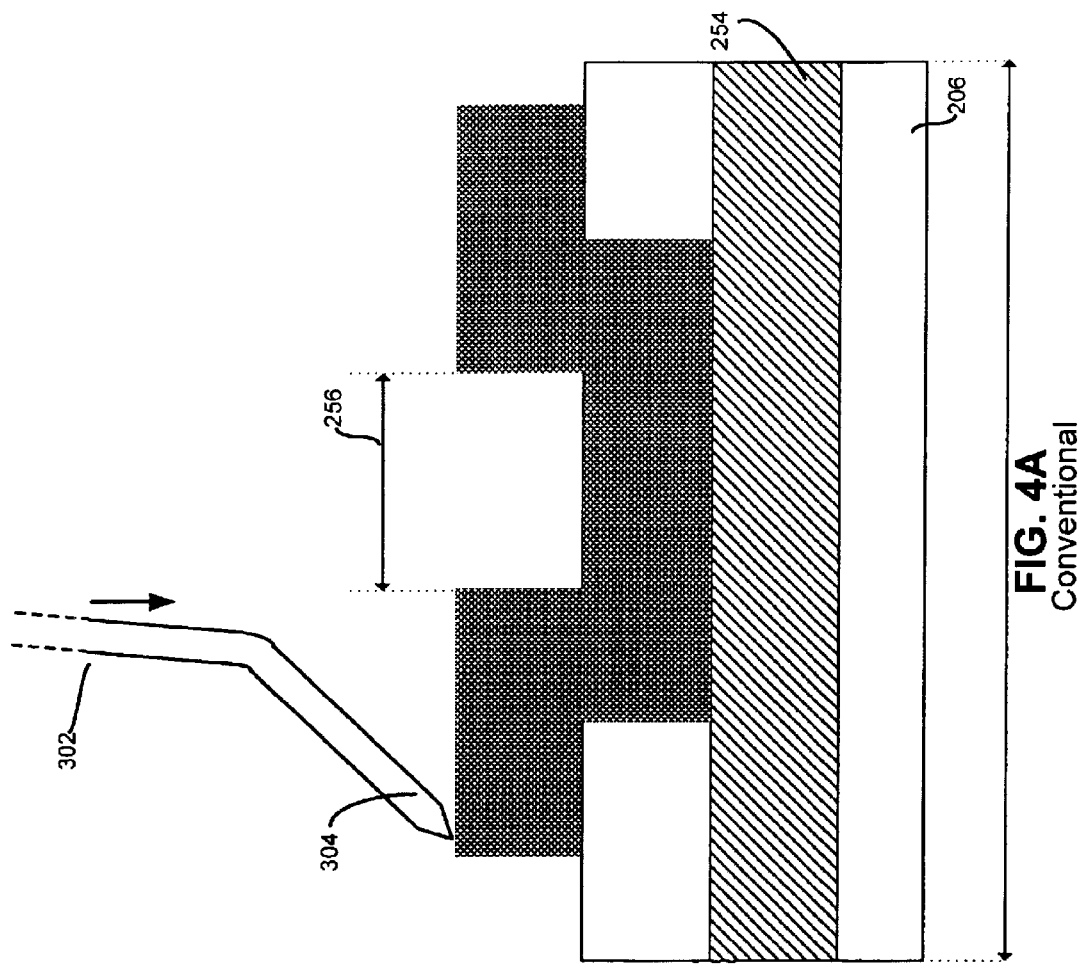
FIG. 4A
Conventional

METAL BOND PAD FOR INTEGRATED CIRCUITS ALLOWING IMPROVED PROBING ABILITY OF SMALL PADS

BACKGROUND OF THE INVENTION

1. Field of the Invention

The present invention is generally related to the design of metal bond pads. The present invention is further related to probing small metal bond pads.

2. Background Art

A probe is know in the art as the instrument that essentially performs the function of extracting minimal energy from the circuit under test and transferring it to a measuring instrument with maximum fidelity. Some types of probes include the following: general Purpose Passive Voltage Probes, Active Voltage Probes, SDM Passive Voltage Probes, Active and Passive Current Probes, etc. All the above mentioned probes are used in direct contact with the tested circuit and collect data through a direct electrical connection with the metal components of the tested circuit. One of the most important problems that arise when using the traditional contact probing technology is that it requires large contact pads that are incompatible with the operation and economic constraints of modem integrated circuits design.

What are needed are techniques, design solutions, and methods for improving the probing ability of small pads when contact probing techniques are used.

BRIEF SUMMARY OF THE INVENTION

The present invention is a metal bond pad that provides electrical and mechanical connection to an integrated circuit (IC). The metal bond pad is configured to accommodate the travel of a probe during probing measurements, without increasing the passivation opening of the bond pad. This enables a higher density of active devices on the IC and therefore increases integration scale and lowers IC cost.

The metal bond pad for the integrated circuit comprises a substrate, a first metal layer and a second metal layer. The substrate has a first metal layer disposed therein, and includes an opening from the top surface in the substrate to access the first metal layer. The second metal layer has a first-end portion, a second-end portion, and a center portion disposed between the first-end portion and the second-end portion. The center portion of the second metal layer is aligned with the opening in the substrate and a bottom surface of the center portion is in contact with the top surface of the first metal layer. A top surface of the center portion has a recessed region that forms a first edge with the first-end portion and a second edge with the second-end portion. The first-end portion of the second metal layer is disposed on the top surface of the substrate and extends from the first edge of the recessed region, with its length defined from the first edge of the recessed region. The second-end portion is also disposed on the top surface of the substrate and extends from the second edge of the recessed region. The second-end portion has its length defined from the second edge of the recessed region, and it is shorter than the length of the first-end portion.

In one embodiment of the invention, the length of the first portion is sized to accommodate the travel of a probe, when the probe is applied on the top surface of the center portion of the second metal layer.

In one embodiment of the invention, the first metal layer is aluminum and the second metal layer is copper. In another embodiment of the present invention, the first metal layer and the second metal layer are made of the same metal.

Further, in different embodiments the first metal layer and the second metal layer are made of the same alloy, for example an aluminum-copper (AlCu) alloy. In another embodiment of the invention, the first metal layer and the second metal layer are made of different alloys.

Another purpose of the present invention is to provide a method of manufacturing metal bond pads, comprising the steps of depositing a first metal layer on a substrate and depositing a second metal layer so that its center portion is in contact with the first metal layer and a first-end portion of the second metal layer is longer than a second-end portion of the second metal layer.

Further features and advantages of the invention, as well as the structure and operation of various embodiments of the invention, are described in detail below, with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

These and other advantages and features of the present invention will become better understood upon consideration of the following detailed description of the invention, when considered in connection with the accompanying drawings, in which like reference numerals designate like parts throughout the figures thereof, and wherein:

FIG. 2 represents a cross-section through a conventional metal bond pad for an integrated circuit.

FIG. 3 represents the probing process of a conventional metal bond pad for an integrated circuit, illustrated in cross-section.

FIG. 4 represents the probing process of a conventional metal bond pad, with a probe pressed and sliding from the conventional metal bond pad.

FIG. 4A represents a conventional solution to the sliding of the probe.

DETAILED DESCRIPTION OF THE INVENTION

The various aspects of the invention relate to improvements performed on the design, configuration, and manufacturing method of metal bond pads. The present invention improves the ability to probe small metal bond pads and allow a significant space economy to be realized on the chip.

Reference is now made in detail to the embodiments of the present invention, examples of which are illustrated in the accompanying drawings and discussed below.

Figure 1:
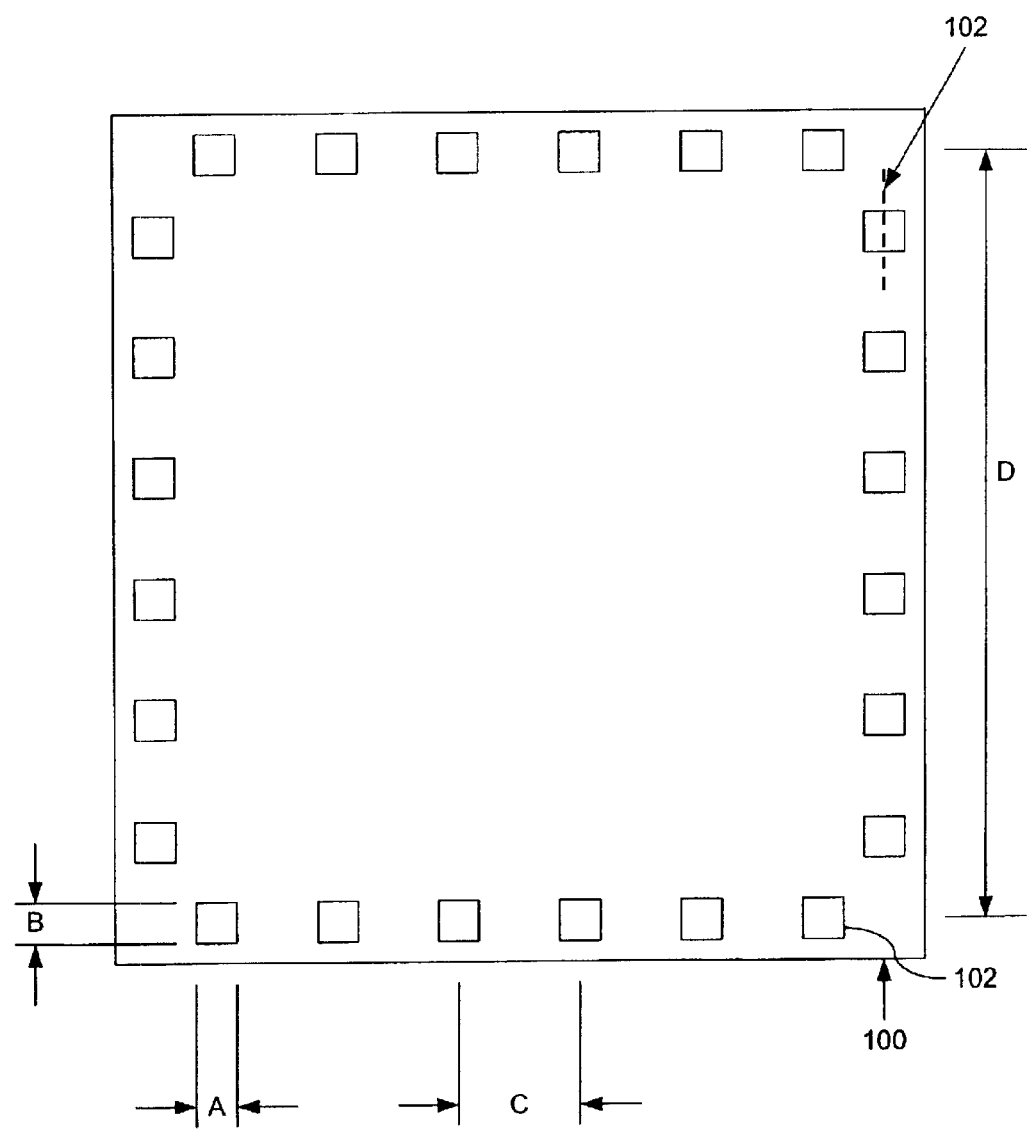
FIG. 1 is a general top-level view of a chip layout with metal bond pads.

FIG. 1 is a basic representation (top view) of a chip layout. The die pad configuration presents only one row of metal bond pads. Chip layouts with two or even three rows of metal bond pads (disposed parallel or staggered) can be also used to illustrate the present invention. The exemplary layout of the chip 100 presents one row of metal bond pads 102, with known dimensions: A and B. The distance between two successive metal bond pads 102 is denominated C. The total length of the chip's side is represented as D. C and D are also known characteristics of the chip.

A cross-section is made through the metal bond pad 102. It is indicated in FIG. 1 with a dotted line.

FIG. 2 represents a cross-section through a conventional metal bond pad. The configuration of metal bond pad 102 comprises a substrate 206 having a first metal layer 208 disposed therein and a second metal layer 214. The substrate 206 can include one or more of the following: a multilayer composite structure that includes a base material, substrates and/or wells of p or n type, diffusion regions and/or active areas, different oxides, implants, polysilicon layers and any other materials utilized during the classical manufacturing process of integrated circuits. The substrate 206 has an opening from the top surface that allows access toward inner metal layers.

The first metal layer 208 is situated inside the substrate 206 and has several of its surfaces in contact with the substrate 206 and one in contact with the second metal layer 214. The bottom surface 224 of first metal layer 208 is in direct contact with the substrate 206, and so are its two lateral surfaces 226 and 228. The dimension associated with the bottom surface 224 of the first metal layer 208 is dimension 230. The sizes associated with the lateral surfaces 226 and 228 of the first metal layer 208 are illustrated in FIG. 2 as dimension 232. The first metal layer 208 has a top surface 212 that is partially in contact with the substrate 206 and partially in contact with a bottom surface 234 of the second metal layer 214. The top surface 212 of the first metal layer 208 is in contact with the substrate 206 through two portions, 218a and 218b, disposed left and right respectively from the contact area between the top surface 212 of the first metal layer 208 and the bottom surface 234 of the second metal layer 214. The first metal layer 208 can be made of a variety of metals and alloys, as would be understood by one skilled in the art.

The second metal layer 214 is divided into 3 main parts: a first-end portion 219, a second-end portion 221, and a center portion 245 that is disposed between the first-end portion 219 and the second-end portion 221. The perimeter of the first-end portion 219 includes the following surfaces: 240, 242, 218 and 244, as illustrated in FIG. 2. The perimeter of the second-end portion 221 includes the following surfaces: 246, 220, 248, and 250, as illustrated in FIG. 2. The center portion 245 of the second metal layer is disposed between the first-end portion 219 and the second-end portion 221 and includes the following surfaces: 238, 222, 252, an 234 as illustrated in FIG. 2. A top surface 222 of the center portion forms a recessed region 233 with the surfaces 244 and 246. The surface 244 can be referred to as an edge of the first-end portion 219, and the surface 246 can referred to as an edge of the second-end portion 221. A symmetry axis 236 is employed to emphasize the symmetric character of this sectional view through a conventional metallic bond pad. The symmetry axis 236 is located in the center of the recessed region 233, which can also be referred to as passivation opening.

The first-end portion 219 of the second metal layer 214 is disposed on the top surface of the substrate 206 and extends from the first edge 244 of the recessed region 233, with its length defined from the first edge 244 of the recessed region 233. The second-end portion 221 is also disposed on the top surface of the substrate 206 and extends from the second edge 246 of the recessed region 233.

The second metal layer 214 is in direct contact with both the substrate 206 and with the first metal layer 208. The contact is realized through several of its lateral surfaces, as illustrated in FIG. 2. The bottom portion 234 of the second metal layer 214 is in direct contact with the first metal layer 208 as described above. The lateral surfaces 238, 240, 250, and 252 allow contact between the second metal layer 214 and the substrate 206. The lateral surfaces 252 and 250 insure contact between the second-end portion and the substrate, respectively.

The center portion 245 has a recessed region 233, and a bottom surface 234 in contact with the first metal layer 208. The width of the recessed region 233 is defined as 216 in FIG. 2. The center portion 245 is configured symmetrically relative to symmetry axis 236. The center portion 245 of the second metal layer 214 is aligned with the opening in the substrate 206 and a bottom surface 234 of the center portion 245 is in contact with the top surface 212 of the first metal layer 208. Herein, width #1 is defined as the sum of lengths of surfaces 218, 222, and 220. Relative to the symmetry axis 236, the width #1 can be defined as the sum of portions 204 and 207, wherein the lengths of these two portions 204 and 207 are equal.

The second metal layer 214 can also be manufactured using a plurality of metals and alloys, as would be understood by a person skilled in the relevant art.

FIG. 3 illustrates a cross-section through a conventional metal bond pad that is probed using a metal probe 302. The metal probe 302 can have different types of tips 304, for example, a flat tip or an E-tip. Its planarity, tip length, probe-wire diameter and other characteristics are known. The probe tip 304 is lowered towards the center portion 245 of the conventional metal bond pad 102, in an attempt to be positioned on the target (the pad's center). The target point (or the pad's center) is defined as being the point located in the center of the surface 222 in the recessed region 233, which is conventionally called the passivation opening. Conventionally, the diameter of the probe tip 304 is smaller than the width of the recessed region 233.

FIG. 4 further illustrates the probing process of a conventional metal bond pad. In order to ensure clear data collection, a good contact between the probe tip 304 and the second metal layer 214 is desired. For this purpose, the probe 302 is pushed downward causing the probe 302 to bend. Due to the pressure exerted from above, the tip 304 can slide laterally from the target point, and can slide outside the recessed region 233. With further pressure, the tip 304 can slide outside the first-end portion 219 (or the second-end portion 221) of the second metal layer 214. This is due to the dimensional limitations of the metal pad.

In order to preserve the probing ability of the circuit with the same probing tool, one conventional solution is to enlarge some of the circuits elements. The passivation opening 233 is enlarged to adapt it to be able to contain the probe tip upon pressure.

FIG. 4A illustrates a conventional solution to the probing problem in FIG. 4. In FIG. 4A the recessed region 233 is enlarged to a width 256 that is greater than width 216. Due to the direct relationship that exists between the size of the recessed region 223 and the width of the first metal layer 208, the size of the first metal layer 208 also increases. This solution exhibits several disadvantages such as increasing the sizes of the metal layers 208 and 214. The increase in the size 230 of the first metal layer 208 increases the required distance between adjacent metal bonds, which decreases the density of active devices that can be placed on the chip.

Figure 5:
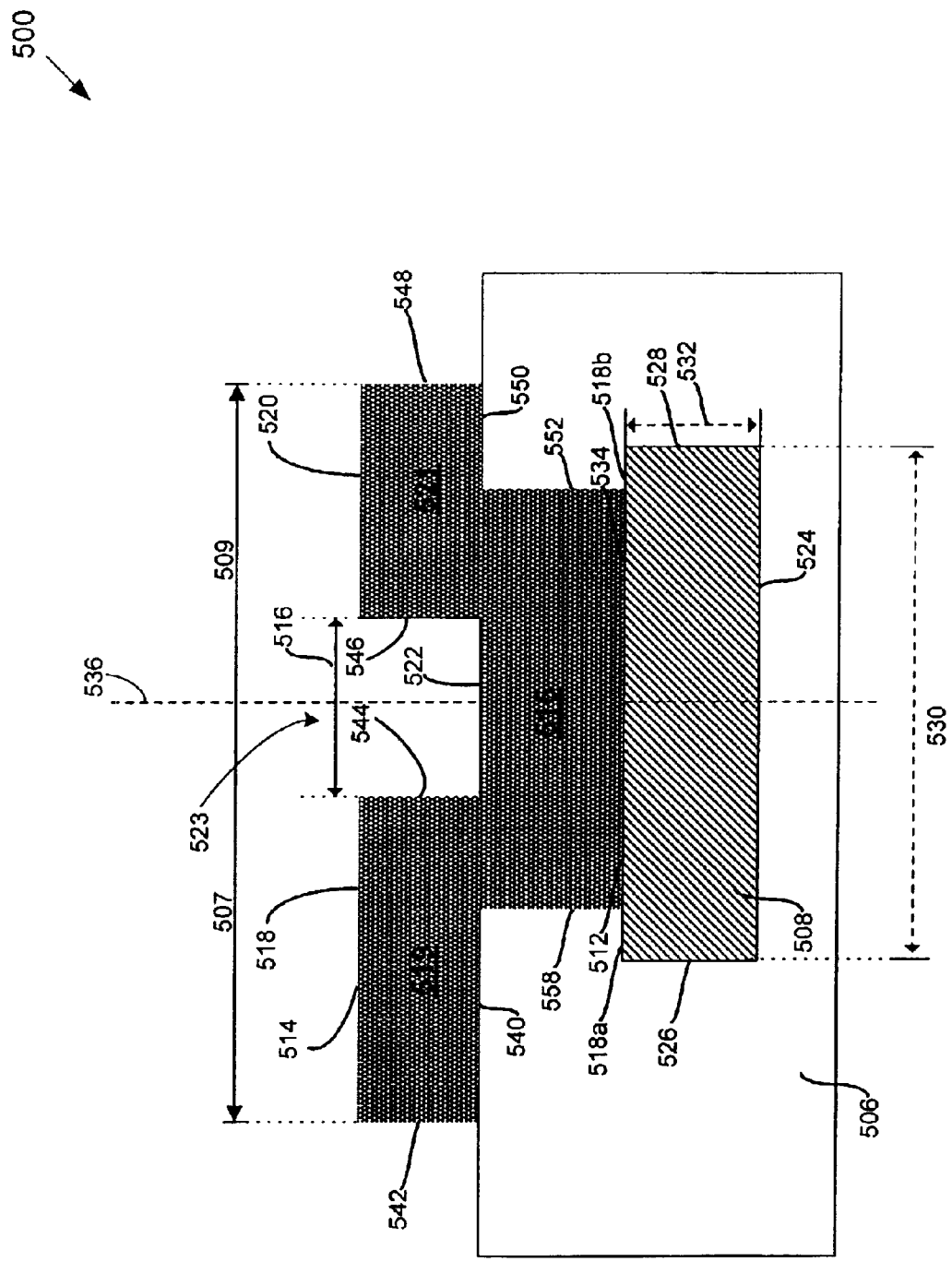
FIG. 5 represents a cross-section through a metal bond pad, according to an embodiment of the present invention.

FIG. 5 illustrates a cross-section through a metal pad 500 implemented according to an embodiment of the present invention. The metal pad 500 includes a substrate 506, a first metal layer 508, and a second metal layer 514. In one embodiment, the substrate 506 is a multilayer composite structure that can include: a plurality of base materials, substrates and/or wells of p or n type, diffusion regions and/or active areas, different oxides, implants, polysilicon layers and any other materials utilized during the manufacturing process of integrated circuits. The substrate has an opening from the top surface that allows access to the inner metal layers.

The first metal layer 508, situated inside the substrate 506, has a plurality of lateral surfaces, several in contact with the substrate 506 and at least one of them in contact with the second metal layer 514. The bottom surface 524 of the first metal layer 508, is in direct contact with the substrate 506 and so are two of its lateral surfaces 526 and 528. The size associated with the bottom surface 524 of the first metal layer 504 is the dimension 530. The size of the lateral surfaces 526 and 528 of the first metal layer 508 is the dimension 532. When compared with the conventional bond pad in FIG. 2, the length 530 of the first metal layer 508 is smaller than corresponding length 230 of the first metal layer illustrated in FIG. 4A. The size 532 is comparable with its conventional counterpart 232. The first metal layer 508 has a top surface 512 that is partially in contact with the substrate 506 and is partially in contact with a bottom surface 534 of the second metal layer 514.

The top surface 512 of the first metal layer 508 is in contact with the substrate 506 through two equally sized portions 518a and 518b, disposed right and left, respectively, from the contact area between the top surface 512 of the first metal layer 508 and the bottom surface 534 of the second metal layer 514. The two portions 518a and 518b are the same as their conventional counter parts 218a and 218b. The sum of the two portions 518a, 518b, and the 534 is equal to the bottom surface 524 and is indicated as dimension 530. The first metal layer 508 can be made of a variety of metals and alloys. In a preferred embodiment of the present invention, the first metal layer 508 is made of Cu. In another preferred embodiment of the present invention the first metal layer 508 is made of AlCu.

The second metal layer is divided into 3 main parts: a first-end portion 519, a second-end portion 521, and a center portion 515 that is disposed between the first-end portion 519 and the second-end portion 521. The perimeter of the first-end portion 519 includes the surfaces: 540, 542, 518, and 544. The perimeter of the second-end portion 521 includes the surfaces: 546, 520, 548, and 550. The center portion 515 of the second metal layer 514 is disposed between the first-end portion 519 and the second-end portion 521 and includes the surfaces: 558, 522, 552, and 534, as illustrated in FIG. 5. The top surface 522 of the center portion 515 forms a recessed region 523 with the surfaces 544 and 546. The surface 544 can be referred to as an edge (544) of the first-end portion 519, and the surface 546 can referred to an edge (546) of the second end portion 521.

A symmetry axis 536 is employed in FIG. 5 to illustrate the relative symmetry of this sectional view compared with the conventional bond in FIG. 2. The recessed region 523 can be referred to as a recessed region 523.

The nomenclature of the first-end portion and the second-end portion can be reversed and is provided only for convenience of discussion. In other words, the portion 521 can be referred to as the first-end portion, and the portion 519 can be referred to as the second-end portion, as will be understood by those skilled in the arts.

The first-end portion 519 of the second metal layer 514 is disposed on the top surface of the substrate 506 and extends from the first edge 544 of the recessed region 523, with its length defined from the first edge 544 of the recessed region 523. The second-end portion 521 is also disposed on the top surface of the substrate 506 and extends from the second edge 546 of the recessed region 523. The first-end portion 519 is longer than the second-end portion 521.

The center portion 515 includes the surface 522, and a lower surface 534 in contact with the first metal layer 508. The width of the surface 522 and the recessed region 523 is defined as 516, as illustrated in FIG. 5. The width 516 of recessed region 523 is equal with the width 216 of recessed region 233, illustrated in FIG. 2.

The length of the surface 518 of the first-end portion 519 is greater than the corresponding length of the surface 218 of the first-end portion 219 of the conventional metal bond pad 102. Furthermore, the length of surface 520 of the second-end portion 521 is greater that the length of the surface 220 of the second-end portion 221 of the conventional metal bond pad 102. Herein, width number 2 is the sum of lengths of 518, 522, and 520. Relative to the symmetry axis 536, the width #2 can also be defined as the sum of length 507 and 509.

In one embodiment of the invention, width #2 (507+509) of bond pad 500 is substantially similar to the width of the first metal layer 254 illustrated by FIG. 4A. However, the length 507 has been elongated relative to the length 204, to allow more probe travel along the top surface 518. This is done by increasing the length of 518 of the first portion 519 relative to the length of 520 of the second-end portion 521. The size 516 of the recessed region 523 remains constant relative to the size of recessed region 216 for a conventional pad 102. This is advantageous because the size 516 of the recessed region 523 also determines the size 530 of the first metal layer 508, since there is a fixed offset between the two. Therefore, maintaining the size 516 of the recessed region 523 allows for corresponding maintenance of size 530 of the first metal layer 508. Accordingly, more active devices can aligned next to each other, and the integration of the IC can be increased, relative to the solution in FIG. 4A.

The second metal layer 514 is in direct contact with both the substrate 506 and with the first metal layer 508. The contact is realized through several of its lateral surfaces, as illustrated in FIG. 5. The bottom surface 534 of the second metal layer 514 is in direct contact with the first metal layer 508. The surfaces 558 and 540 allow contact between the second metal layer 514 and the substrate 506. The surfaces 552 and 550 also provide contact between the second metal layer 514 and the substrate 506.

The second metal layer can be manufactured using a plurality of metals and alloys. In a preferred embodiment of the present invention, the second metal layer is manufactured using Aluminum (Al). In another preferred embodiment of the present invention, the second metal layer is manufactured using Aluminum-Copper (AlCu).

Figure 6:
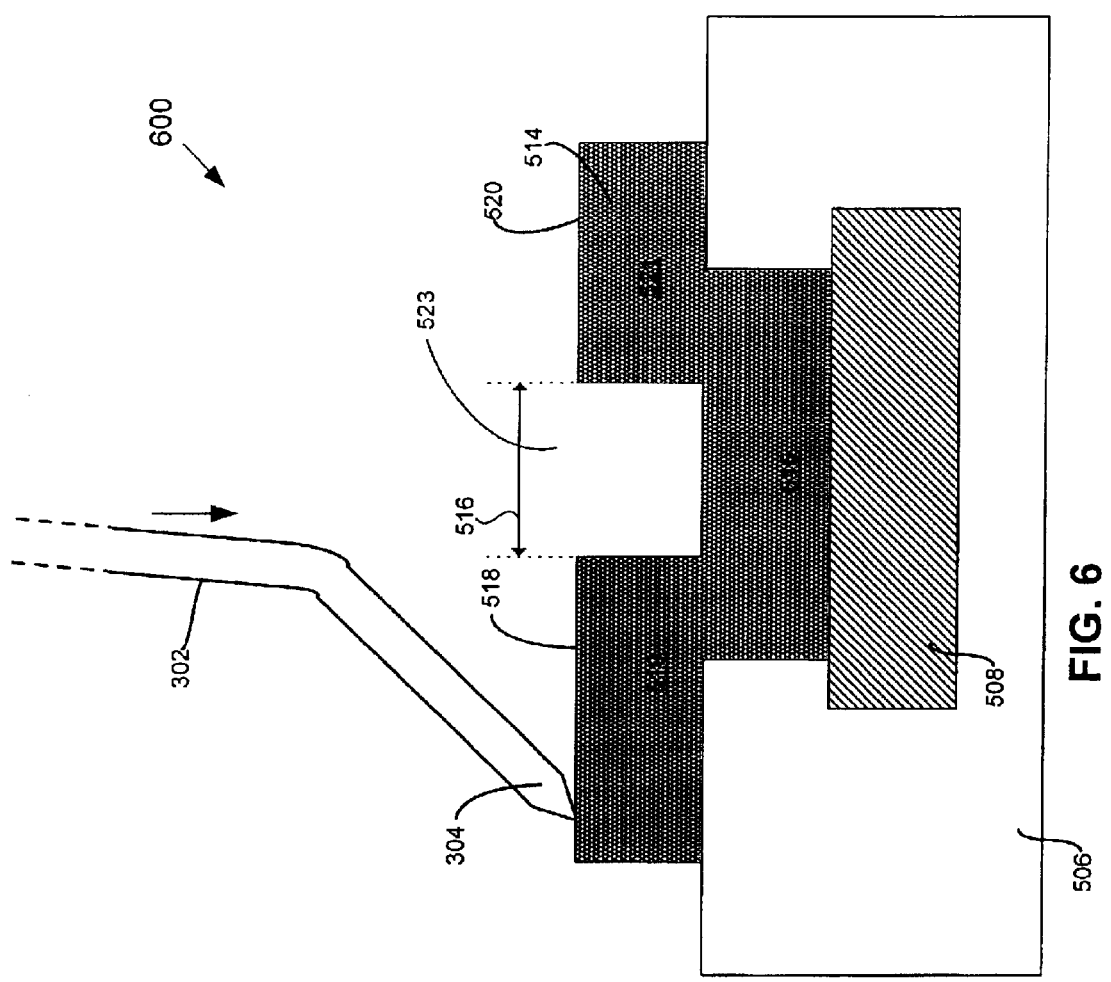
FIG. 6 represents the probing process performed on a metal bond pad implemented according to the present invention.

FIG. 6 illustrates a cross-section of the metal pad 500, during probing. The probe 302 is lowered towards the recessed region 523. The probe 302 is pushed down in order to insure better electrical contact. The probe 302 bends and over-drives the recessed region 523 sliding along the first end portion 519 of the second metal layer 514. Due to the increased length of the first-end portion 519, the tip 304 maintains contact with the top surface 518 of the first-end portion 519 and does not extend beyond the first-end portion 519. This allows probing of the metal bond pad 520 without having to apply any further corrective measures. (e.g. FIG. 4A)

Another advantage of the configuration for the metal bond pad proposed by the present invention is that the distance C between two successive metal bond pads (illustrated in FIG. 1) can be reduced. The distance C is reduced and implicitly the size of the first metal layer is reduced. Therefore, the number of metal bond pads on the chip layout can be increased.

Deposition Method:

The method of the present invention refers to the manufacture of metal bond pads as they are proposed by the present invention and are illustrated in FIG. 5.

The method is a dual step method, comprising a first deposition step that refers to depositing the first metal layer 508 on the substrate 506. During a second depositing step, the second metal layer 514 is deposited in contact with the first metal layer 508 and on the top of the substrate 506, so that the second metal layer 514 has a first-end portion 519 and a second-end portion 521, where the first-end portion 519 is longer than the second end portion 521 of the second metal layer, while the size of the passivation opening 523 is maintained the same as in a conventional bondpad.

Conclusion:

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A bond pad for an integrated circuit, comprising:
   a substrate having a first metal layer disposed therein, said substrate having an opening from a top surface of said substrate to a top surface of said first metal layer; and
   a second metal layer having a first-end portion, a second-end portion, and a center portion disposed between said first-end portion and said second-end portion,
       said center portion aligned with said opening in said substrate and a bottom surface of said center portion in direct contact with a top surface of said first metal layer, a top surface of said center portion forming a recessed region with a first edge with said first-end portion and a second edge with said second-end portion,
       said first-end portion disposed on said top surface of said substrate and extending from said first edge of said recessed region and having a length defined from said first edge of said opening, and
       said second-end portion disposed on said top surface of said substrate and extending from said second edge of said recessed region and having a length defined from said second edge of said opening that is longer than said length of said first-portion,
   wherein the width of said first metal layer is less than the width of said second metal layer.

2. The bond pad of claim 1, wherein said length of said second portion is determined to accommodate travel of a probe when said probe is applied to a top surface of said center portion of said second metal layer.

3. The bond pad of claim 1, wherein said travel is responsive to a force applied to one end of said probe, said force sufficient to cause electrical contact between said probe and said center portion of said second metal layer.

4. The bond pad of claim 1, wherein said first metal layer is aluminum and said second metal layer is copper.

5. The bond pad of claim 1, wherein said center portion is recessed relative to said first-end portion and said second-end portion.

6. The bond pad of claim 1, wherein the opening is a passivation opening.

7. The bond pad of claim 1, wherein a length of said first metal layer is a fixed offset relative to a length of said passivation opening.

8. A bond pad for an integrated circuit, comprising:
   a substrate having a first metal layer disposed therein, said substrate having an opening from a top surface of said substrate to a top surface of said first metal layer; and
   a second metal layer having a first-end portion, a second-end portion, and a center portion disposed between said first-end portion and said second-end portion,
       said center portion aligned with said opening in said substrate and a bottom surface of said center portion in direct contact with a top surface of said first metal layer, a top surface of said center portion forming a recessed region with a first edge with said first-end portion and a second edge with said second-end portion,
       said first-end portion disposed on said top surface of said substrate and extending from said first edge of said recessed region, and
       said second-end portion disposed on said top surface of said substrate and extending from said second edge of said recessed region and having a length determined to accommodate travel of a probe when said probe is applied to a top surface of said center portion of said second metal layer,
   wherein the width of said first metal layer is less than the width of said second metal layer.

9. The bond pad of claim 8, wherein said first metal layer and said second metal layer are made of a same metal.

10. The bond pad of claim 9, wherein said same metal is Aluminum (Al).

11. The bond pad of claim 9, wherein said same metal is Copper (Cu).

12. The bond pad of claim 8, wherein said first metal layer and said second metal layer are made of a same alloy.

13. The bond pad of claim 12, wherein said same alloy is aluminum-copper (AlCu).

14. The bond pad of claim 8, wherein said first metal layer and said second metal layer are made of different metals.

15. The bond pad of claim 8, wherein said first metal layer and said second metal layer are made of different alloys.

* * * * *